(12) United States Patent
Imada et al.

(10) Patent No.: US 10,074,759 B2
(45) Date of Patent: Sep. 11, 2018

(54) SOLAR CELL MODULE

(71) Applicant: Panasonic Intellectual Property Management Co., Ltd., Osaka (JP)

(72) Inventors: Naoto Imada, Osaka (JP); Tasuku Ishiguro, Osaka (JP); Akimichi Maekawa, Osaka (JP); Masahiro Iwata, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/381,040

(22) Filed: Dec. 15, 2016

(65) Prior Publication Data

US 2017/0098725 A1 Apr. 6, 2017

Related U.S. Application Data

(63) Continuation of application No. PCT/JP2015/002955, filed on Jun. 12, 2015.

(30) Foreign Application Priority Data

Jun. 18, 2014 (JP) ................................. 2014-125779

(51) Int. Cl.
*H01L 31/044* (2014.01)
*H01L 31/048* (2014.01)

(52) U.S. Cl.
CPC ........ *H01L 31/0481* (2013.01); *H01L 31/044* (2014.12)

(58) Field of Classification Search
CPC ........ H01L 31/00–31/078; Y02E 10/50–10/60
(Continued)

(56) References Cited

U.S. PATENT DOCUMENTS

2009/0173384 A1 7/2009 Ooi et al.
2012/0285536 A1 11/2012 Ishiguro et al.
(Continued)

FOREIGN PATENT DOCUMENTS

EP 2677554 A1 12/2013
JP 2007-150069 A 6/2007
(Continued)

OTHER PUBLICATIONS

International Search Report (ISR) dated Aug. 4,2015 for PCT Application No. PCT/JP2015/002955.
(Continued)

*Primary Examiner* — Bach T Dinh
(74) *Attorney, Agent, or Firm* — Metrolexis Law Group, PLLC

(57) ABSTRACT

A solar cell module includes: a plurality of solar cells; a front surface encapsulant member which is disposed on a front surface side of the plurality of solar cells and includes a first polyolefin-based material; a back surface encapsulant member which is disposed on a back surface side of the plurality of solar cells and includes a second polyolefin-based material; an intermediate member which is disposed between the front surface encapsulant member and the back surface encapsulant member and includes a polymer material having either one of a higher polarity and a higher water absorbability than the first polyolefin-based material and the second polyolefin-based material; and a front surface protective member and a back surface protective member disposed to place the plurality of solar cells, the front surface encapsulant member, and the back surface encapsulant member between the front surface protective member and the back surface protective member.

8 Claims, 4 Drawing Sheets

(58) Field of Classification Search
USPC .................................................. 136/243–265
See application file for complete search history.

(56) References Cited

U.S. PATENT DOCUMENTS

| | | | |
|---|---|---|---|
| 2013/0247963 A1 | 9/2013 | Ishiguro | |
| 2013/0340804 A1* | 12/2013 | Moon | H01L 31/0516 136/244 |
| 2015/0114464 A1 | 4/2015 | Ishiguro et al. | |
| 2015/0155409 A1* | 6/2015 | Nakaya | H01L 31/0481 428/500 |

FOREIGN PATENT DOCUMENTS

| | | |
|---|---|---|
| JP | 2013-12589 A | 1/2013 |
| JP | 2013-125778 A | 6/2013 |
| JP | 2014-007384 A | 1/2014 |
| WO | 02/103809 A1 | 12/2002 |
| WO | 2011/093383 A1 | 8/2011 |
| WO | 2012/053042 A1 | 4/2012 |
| WO | 2012/073751 A1 | 6/2012 |

OTHER PUBLICATIONS

The Extended European Search Report dated May 11, 2017 for a counterpart European application No. 15810466.1.

* cited by examiner

SOLAR CELL MODULE

CROSS REFERENCE TO RELATED APPLICATIONS

This application is a U.S. continuation application of PCT International Patent Application Number PCT/JP2015/002955 filed on Jun. 12, 2015, which claims the benefit of priority of Japanese Patent Application Number 2014-125779 filed on Jun. 18, 2014, the entire contents of both of which are hereby incorporated by herein reference.

BACKGROUND

1. Technical Field

The present disclosure relates to a solar cell module.

2. Description of the Related Art

A solar cell module including solar cells is presumed to be installed outdoors, and thus is required to have high heat resistance and high moisture resistance. To ensure high heat resistance and high moisture resistance, the solar cell module is provided with a structure in which the solar cells are sealed with a substrate and encapsulants.

Patent Literature (PTL) 1 (Japanese Unexamined Patent Application Publication No. 2007-150069) discloses a sealed structure of a solar cell module in which a front encapsulant layer is disposed between a transparent front substrate and solar cells, and a back encapsulant layer is disposed between a back protective sheet and solar cells. The front encapsulant layer and the back encapsulant layer each include a polyolefin-based encapsulant which is polyethylene or a polyethylene polymer. The polyolefin-based encapsulant is a material capable of preventing hydrolysis from producing acetic acid to reduce corrosion of solar cells. With the solar cell module disclosed by PTL 1, even when a hot spot phenomenon or the like causes a temperature to change, adjusting the above-mentioned encapsulant to have low density makes it possible to prevent crystallization of polyethylene and reduce clouding of the encapsulant.

SUMMARY

However, when hot spots or the like causes a temperature to rapidly change with the solar cell module disclosed by PTL 1 containing moisture, the moisture vaporizes, and bulging (volume expansion) and bubbles occur especially in an interface between the front encapsulant layer and the back encapsulant layer. In addition, the bulging and the bubbles cause separation in the interface.

In view of this, the present disclosure has been conceived to solve the above problems, and an object of the present disclosure is to provide a solar cell module capable of reducing corrosion of solar cells and preventing bulging and separation.

In order to solve the above problem, a solar cell module according to the present disclosure includes: a plurality of solar cells; a front surface encapsulant member which is disposed on a front surface side of the plurality of solar cells and includes a first polyolefin-based material; a back surface encapsulant member which is disposed on a back surface side of the plurality of solar cells and includes a second polyolefin-based material; an intermediate member which is disposed between the front surface encapsulant member and the back surface encapsulant member, is in contact with the front surface encapsulant member and the back surface encapsulant member, and includes a polymer material having either one of a higher polarity and a higher water absorbability than the first polyolefin-based material and the second polyolefin-based material; a front surface protective member disposed to place the front surface encapsulant member between the front surface protective member and the plurality of solar cells; and a back surface protective member disposed to place the back surface encapsulant member between the back surface protective member and the plurality of solar cells.

The solar cell module according to the present disclosure makes it possible to reduce corrosion of solar cells and prevent bulging and separation.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF EMBODIMENTS

The following describes a solar cell module according to embodiments of the present disclosure with reference to the drawings. It should be noted that the embodiments described below is merely a preferred illustration of the present disclosure. Therefore, numerical values, shapes, materials, structural components, the arrangement and connection of the structural components, etc. shown in the following embodiment are mere examples, and are not intended to limit the scope of the present disclosure. Moreover, among the structural components in the embodiments below, structural components not recited in any one of independent claims which indicate the broadest concepts of the present disclosure are described as arbitrary structural components.

Furthermore, the respective figures are schematic diagrams and are not necessarily precise illustrations. In addition, in the respective diagrams, identical structural components are given the same reference signs.

In this DESCRIPTION, a "front surface" of a solar cell denotes a surface which more light can enter inwardly in comparison to a "back surface" which is a surface opposite the front surface (at least 50 to 100% of light enters inwardly from the front surface). Examples of the front surface include a surface which no light enters inwardly from a "back surface" side. In addition, a "front surface" of a solar cell module denotes a surface which light on a side opposite the "front surface" of the solar cell can enter, and a "back surface" of the solar cell module denotes a surface opposite the front surface of the solar cell module. It should be noted that, unless specifically limited, an expression such as "provide a second member on a first member" is not intended only for a case where the first and second members are provided in direct contact with each other. In other words, examples of this expression include a case where another member is between the first and second members. It should also be noted that regarding the expression "substantially XX," for example, "substantially the same" is intended to include not only exactly the same but also something that can be substantially recognized as the same.

EMBODIMENTS

1. Basic Configuration of Solar Cell Module

Figure 1:
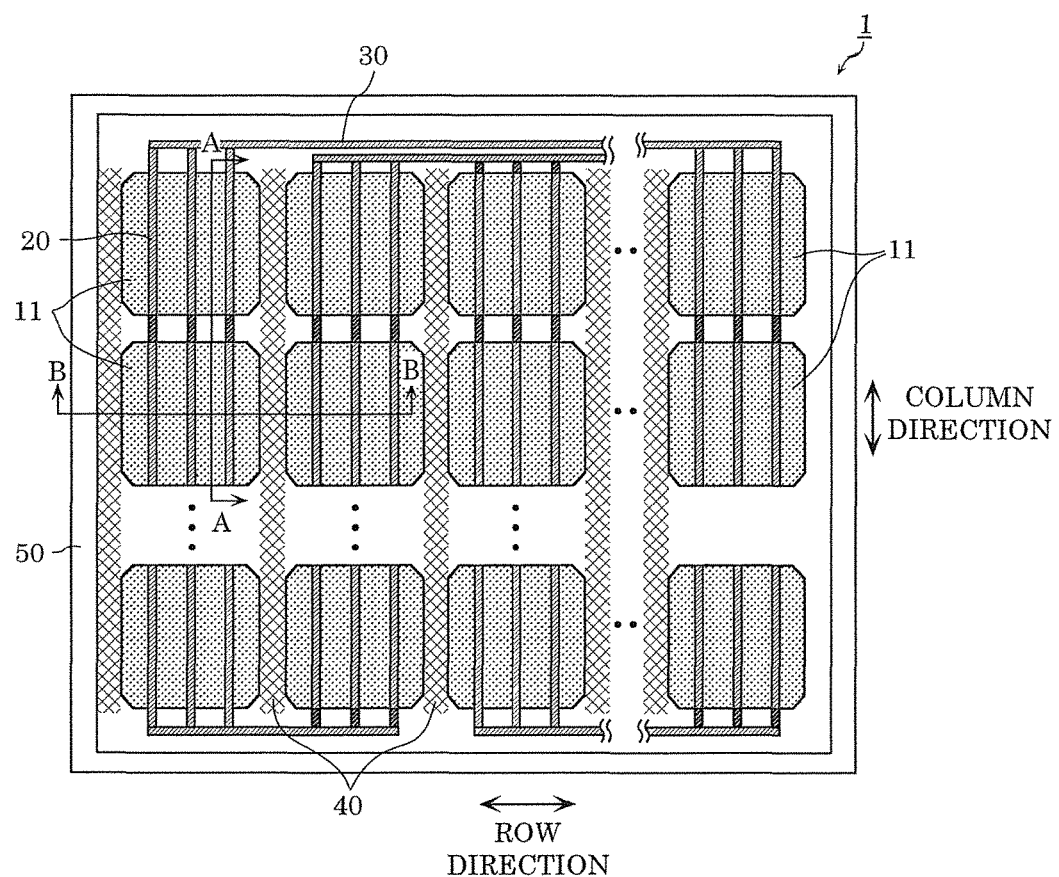
FIG. 1 is a schematic plan view of a solar cell module according to an embodiment.

The following describes an exemplary basic configuration of a solar cell module according to the embodiments, with reference to FIG. 1.

FIG. 1 is a schematic plan view of the solar cell module according to the embodiments. Solar cell module 1 shown by the figure includes solar cells 11, tab lines 20, connecting lines 30, intermediate members 40, and frame 50. It is to be noted that, although not shown by FIG. 1, solar cell module 1 further includes a front surface encapsulant member, a back surface encapsulant member, a front surface protective member, and a back surface protective member.

Solar cells 11 are planar photovoltaic elements which are arranged in a matrix on a flat surface and generate electric power in response to light irradiation.

Tab lines 20 each are a line member which electrically connects solar cells 11 neighboring in a column direction.

Connecting lines 30 each are a line member which connects solar cell strings. It is to be noted that the solar cell strings each are an aggregate of solar cells 11 arranged in the column direction and connected by tab line 20.

Frame 50 is an outer frame member which covers an outer periphery of a panel on which solar cells 11 are two-dimensionally arrayed.

Figure 4:
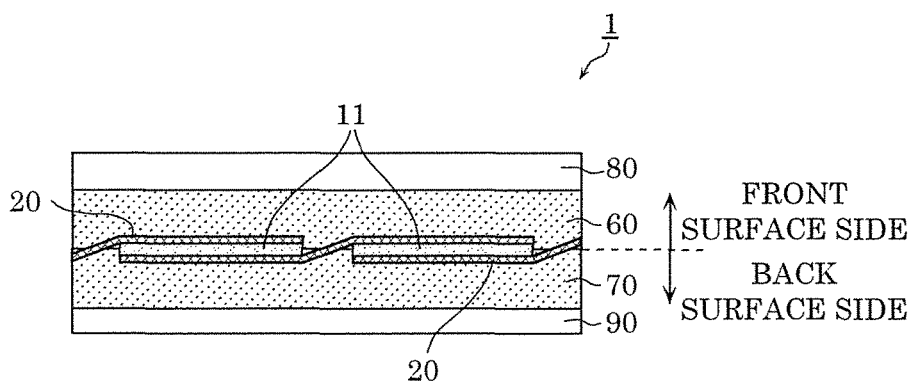
FIG. 4 is a structural cross-sectional view of the solar cell module according to the embodiments, in a column direction.
Figure 5:
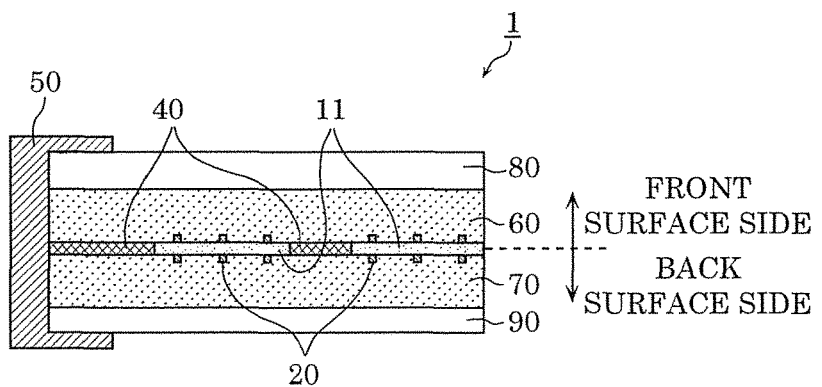
FIG. 5 is a structural cross-sectional view of the solar cell module according to the embodiments, in a row direction.

Intermediate members 40 are disposed in regions between solar cells 11 neighboring in a row direction and between the solar cell strings and frame 50. Intermediate members 40, the front surface encapsulant member, the back surface encapsulant member, the front surface protective member, and the back surface protective member will be described in detail when FIGS. 4 and 5 are described.

2. Structure of Solar Cell

The following describes a structure of each solar cell 11 which is a main component of solar cell module 1.

Figure 2:
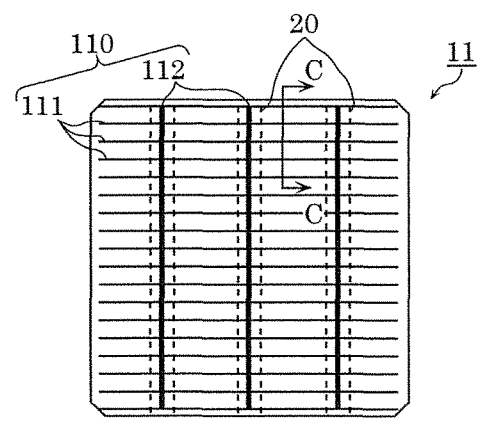
FIG. 2 is a plan view of a solar cell according to the embodiments.

FIG. 2 is a plan view of a solar cell according to the embodiments. As shown by the figure, solar cell 11 is substantially square in a plan view. Moreover, on a surface of solar cell 11, bus bar electrodes 112 having a stripe shape are formed in parallel to each other, and finger electrodes 111 having a stripe shape are formed in parallel to each other to cross bus bar electrodes 112 at right angles. Bus bar electrodes 112 and finger electrodes 111 constitute collector electrode 110. Collector electrode 110 is formed using, for example, a conductive paste including conductive particles such as Ag (silver). It is to be noted that, for example, a line width of bus bar electrodes 112 is 1.5 mm, a line width of finger electrodes 111 is 100 μm, and a pitch of finger electrodes 111 is 2 mm. Furthermore, tab lines 20 are bonded onto bus bar electrodes 112.

Figure 3:
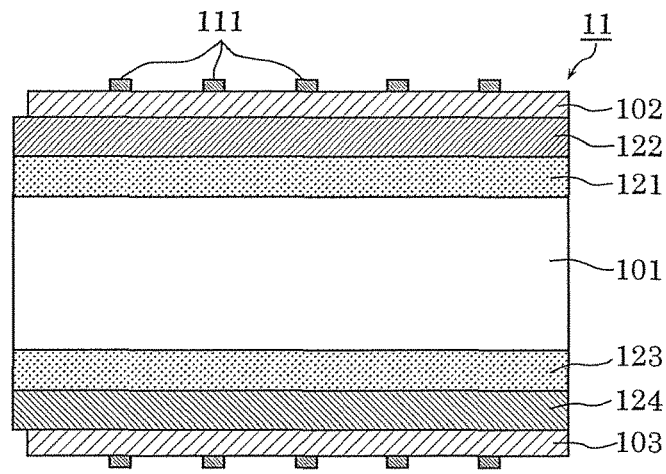
FIG. 3 is a cross-sectional view illustrating a laminated structure of the solar cell according to the embodiments.

FIG. 3 is a cross-sectional view illustrating a laminated structure of the solar cell according to the embodiments. It is to be noted that this figure is a C-C cross-sectional view of solar cell 11 in FIG. 2. As illustrated by FIG. 3, i-type amorphous silicon film 121 and p-type amorphous silicon film 122 are formed on a main surface of n-type monocrystalline silicon wafer 101 in listed order. N-type monocrystalline silicon wafer 101, i-type amorphous silicon film 121, and p-type amorphous silicon film 122 constitute a photoelectric conversion layer, and n-type monocrystalline silicon wafer 101 functions as a main power generation layer. Moreover, light-receiving surface electrode 102 is formed on p-type amorphous silicon film 122. As illustrated by FIG. 2, collector electrode 110 including bus bar electrodes 112 and finger electrodes 111 is formed on light-receiving surface electrode 102. It is to be noted that, of collector electrode 110, only finger electrodes 111 are illustrated by FIG. 3.

Moreover, i-type amorphous silicon film 123 and n-type amorphous silicon film 124 are formed on a back surface of n-type monocrystalline silicon wafer 101 in listed order. In addition, light-receiving surface electrode 103 is formed on n-type amorphous silicon film 124, and collector electrode 110 including bus bar electrodes 112 and finger electrodes 111 is formed on light-receiving surface electrode 103.

It is to be noted that p-type amorphous silicon layer 122 and n-type amorphous silicon layer 124 may be formed on a back surface side of n-type monocrystalline silicon wafer 101 and a light receiving surface side of n-type monocrystalline silicon wafer 101, respectively.

Collector electrode 110 can be formed by, for example, a printing method such as a screen printing method with a thermosetting resin conductive paste using a resin material as a binder and conductive particles such as silver particles as a encapsulant.

To improve p-n junction characteristics, solar cell 11 according to the embodiments has a structure in which i-type amorphous silicon film 121 is provided between n-type monocrystalline silicon wafer 101 and p-type amorphous silicon film 122 or n-type amorphous silicon film 124.

In solar cell 11 according to the embodiments, light-receiving surface electrode 102 on a front surface side of n-type monocrystalline silicon wafer 101 and light-receiving surface electrode 103 on a back surface side of n-type monocrystalline silicon wafer 101 each function as a light-receiving surface. Charge carriers generated in n-type crystalline silicon wafer 101 diffuse as photocurrent into light-receiving surface electrode 102 on the front surface side and light-receiving surface electrode 103 on the back surface side, and are collected by collector electrode 110.

Light-receiving surface electrodes 102 and 103 each are a transparent electrode including, for example, ITO (indium tin oxide), $SnO_2$ (tin oxide), or ZnO (zinc oxide). It is to be noted that when light is entered only from a side of light-receiving surface electrode 102 on the front surface side, light-receiving surface electrode 103 may be a non-transparent metal electrode.

It is to be noted that, instead of collector electrode 110, an electrode formed on the entire surface of light-receiving surface electrode 103 as a collector electrode on the back surface side.

3. Structure of Solar Cell Module

The following mainly describes essential features of a structure of solar cell module 1 according to the embodiments.

FIG. 4 is a structural cross-sectional view of the solar cell module according to the embodiments, in the column direction. FIG. 5 is a structural cross-sectional view of the solar cell module according to the embodiments, in the row direction. Specifically, FIG. 4 is an A-A cross-sectional view of the plan view in FIG. 1, and FIG. 5 is a B-B cross-sectional view of the plan view in FIG. 1.

As illustrated by FIG. 4, in solar cell module 1 according to the embodiments, tab lines 20 are disposed on a front surface and a back surface of solar cell 11. In two solar cells 11 neighboring in the column direction, tab line 20 disposed on a front surface of one of solar cells 11 is also disposed on a back surface of the other of solar cells 11. More specifically, a back surface at one end portion of tab line 20 is bonded to bus bar electrode 112 (not illustrated) on a front surface side of the one of solar cells 11. Moreover, a front surface at the other end portion of tab line 20 is bonded to bus bar electrode 112 (not illustrated) on a back surface side of the other of solar cells 11. Consequently, a solar cell string including solar cells 11 disposed in the column direction has a structure in which solar cells 11 are connected in series in the column direction.

Here, tab line 20 and bus bar electrode 112 are bonded with a resin adhesive, for example. In other words, tab line 20 is connected to solar cell 11 via the resin adhesive. The resin adhesive preferably hardens below a melting point of eutectic solder, that is, at a temperature below approximately 200° C. Examples of the resin adhesive include a thermosetting resin adhesive including acrylic resin or highly flexible polyurethane, and a two-liquid reaction adhesive obtained by mixing epoxy resin, acrylic resin, or urethane resin with a curing agent. In addition, the resin adhesive may include particles having conductivity. Examples of such particles include nickel and gold-coated nickel.

It is to be noted that, for example, tab line 20 may include a conductive material such as solder-coated copper foil.

Moreover, as illustrated by FIGS. 4 and 5, front surface protective member 80 is provided on a front surface side of solar cells 11, and back surface protective member 90 is provided on a back surface side of solar cells 11. Front surface encapsulant member 60 is disposed between a surface including solar cells 11 and front surface protective member 80, and back surface encapsulant member 70 is disposed between a surface including solar cells 11 and back surface protective member 90. Front protective member 80 and back surface protective member 90 are fixed by front surface encapsulant member 60 and back surface encapsulant member 70, respectively. To put it differently, front surface encapsulant member 60 is disposed on the front surface side of solar cells 11, and back surface encapsulant member 70 is disposed on the back surface side of solar cells 11 to place solar cells 11 between front surface encapsulant member 60 and back surface encapsulant member 70. In addition, front surface protective member 80 is disposed to place front surface encapsulant member 60 between front surface protective member 80 and solar cells 11, and back surface protective member 90 is disposed to place back surface encapsulant member 70 between back surface protective member 90 and solar cells 11.

Front surface protective member 80 is a member for protecting the inside of solar cell module 1 from wind and rain, external shock, fire, etc., and ensuring long-term reliability of solar cell module 1 exposed outdoors. In view of this, front surface protective member 80 may include, for example, a glass having translucency and impermeability, a film-like or plate-like hard resin member having translucency and impermeability, or the like. Back surface protective member 90 is a member which protects a back surface of solar cell module 1 from the external environment, and may include a resin film such as PTE (polyethylene terephthalate) or a laminated film having a structure in which Al foil is placed between resin films.

Front surface encapsulant member 60 is an encapsulant filled in a space between solar cells 11 and front surface protective member 80. Back surface encapsulant member 70 is an encapsulant filled in a space between solar cells 11 and back surface protective member 90. Front surface encapsulant member 60 and back surface encapsulant member 70 have a sealing function for isolating solar cells 11 from the external environment. Disposing front surface encapsulant member 60 and back surface encapsulant member 70 makes it possible to ensure high heat resistance and high humidity resistance of solar cell module 1 to be installed outdoors.

Front surface encapsulant member 60 includes, as a main component, a first polyolefin-based material which is a polyolefin-based encapsulant. Back surface encapsulant member 70 includes, as a main component, a second polyolefin-based material which is a polyolefin-based encapsulant. Here, examples of the polyolefin-based encapsulants include polyethylene, polypropylene, and a copolymer of polyethylene and polypropylene.

Applying the polyolefin-based encapsulants as front surface encapsulant member 60 and back surface encapsulant member 70 makes it possible to prevent hydrolysis from producing acetic acid and reduce corrosion of solar cells 11 by acetic acid.

White particles such as titanium oxide are preferably included in back surface encapsulant member 70 to improve an output by taking advantage of reflection of light from back surface encapsulant member 70. In this case, front surface encapsulant member 60 is different from back surface encapsulant member 70, and thus an adhesive force in an interface between front surface encapsulant member 60 and back surface encapsulant member 70 is more likely to decrease, and bulging and bubbles are more likely to occur in comparison to a case where front surface encapsulant member 60 is made the same as back surface encapsulant member 70. For this reason, when front surface encapsulant member 60 is different from back surface encapsulant member 70, intermediate member 40 is especially preferably provided to the interface.

Frame 50 made of, for example, aluminum is attached via an adhesive to surround front surface protective member 80, back surface protective member 90, front surface encapsulant member 60, back surface encapsulant member 70, and intermediate members 40.

As illustrated by FIG. 5, solar cell module 1 according to the embodiments includes intermediate members 40 in boundary portions between front surface encapsulant member 60 and back surface encapsulant member 70 in a cross-sectional view, the boundary portions being regions in which no solar cell 11 is disposed in a plan view. In other words, intermediate members 40 are between front surface encapsulant member 60 and back surface encapsulant member 70, and are disposed in regions other than regions in which solar cells 11 are disposed in a plan view.

Intermediate members 40 include, as a main component, a polymer material having a higher polarity than the first polyolefin-based material and the second polyolefin-based material.

Alternatively, intermediate members 40 include, as a main component, a polymer material having a higher water absorbability than the first polyolefin-based material and the second polyolefin-based material.

Stated differently, intermediate members 40 include a material capable of absorbing more water, polar molecules, than the first polyolefin-based material and the second polyolefin-based material. It is to be noted that one of physical quantities for determining a level of a water absorbability is a water absorption.

It is to be noted that examples of a preferred polymer material included in intermediate members 40 include at least one of ethylene-vinyl acetate (EVA) and polyethylene terephthalate. In addition, examples of a polymer material included in intermediate members 40 include a polymer material having hydrophilicity, such as polyvinyl alcohol, ethylene-vinly-alcohol copolymer, and polyvinyl acetate.

It is to be noted that a level of the aforementioned "polarity" can be evaluated based on, for example, an SP (solubility parameter) value which is a solubility parameter to be an indication of a solubility of a two-component solution. Evaluation of the aforementioned solubility parameter makes it possible to determine that a solubility of two components is higher as a difference in SP values of the two components is smaller. When this is applied to the embodiments, it can be determined that a material having an SP value closer to an SP value of water is more easily dissolved in water. In view of this, that a polymer material included in intermediate members 40 has a higher polarity than the first polyolefin-based material and the second polyolefin-based material means that an SP value of the polymer material is closer to the SP value of water, a polar material, than SP values of the first polyolefin-based material and the second polyolefin-based material. The following exemplifies a case where the first polyolefin-based material and the second polyolefin-based material are polyethylene, and a polymer material included in intermediate members 40 is polyethylene terephthalate. In this case, the SP value (theoretical value) of water is 23.4, whereas an SP value of polyethylene is 7.9, and an SP value of polyethylene terephthalate is 10.7. In other words, a difference in the SP values of water and polyethylene is 15.5, whereas a difference in the SP values of water and polyethylene terephthalate is 12.7. Stated differently, the SP value (10.7) of polyethylene terephthalate is closer to the SP value (23.4) of water than the SP value (7.9) of polyethylene. Accordingly, it is determined that polyethylene terephthalate has a higher polarity than polyethylene.

With a configuration of a conventional solar cell module in which the aforementioned intermediate members are not between a front surface encapsulant layer and a back surface encapsulant layer, when a rapid temperature change causes internal moisture to vaporize, especially bulging (volume expansion) and bubbles occur in an interface between the front surface encapsulant layer and the back surface encapsulant layer. This is likely to cause separation or deformation in the interface.

By contrast, with solar cell module 1 according to the embodiments, even when a rapid temperature change causes internal moisture to vaporize, intermediate members 40 disposed between front surface encapsulant member 60 and back surface encapsulant member 70 and in contact with front surface encapsulant member 60 and back surface encapsulant member 70 absorb the vaporized moisture. As a result, intermediate members 40 do not expand in volume, and it is possible to prevent bulging (volume expansion) and bubbles from occurring in the interface between front surface encapsulant member 60 and back surface encapsulant member 70. Accordingly, front surface encapsulant member 60 including the first polyolefin-based material as the main component and back surface encapsulant member 70 including the second polyolefin-based material as the main component make it possible to reduce corrosion of solar cells 11, and intermediate members 40 make it possible to prevent the bulging or separation.

It is to be noted that intermediate member 40 is preferably disposed in at least a portion of a space between front surface encapsulant member 60 and back surface encapsulant member 70, the space corresponding to the interface between front surface encapsulant member 60 and back surface encapsulant member 70 when intermediate member 40 is not disposed, and intermediate member 40 is further preferably disposed in the space corresponding to almost all of the interface. In addition, an order of priority for disposition locations of intermediate member 40 is (1) disposed between solar cell strings, (2) disposed between solar cells 11, and (3) disposed at an outer periphery of solar cell 11.

Moreover, although, as illustrated by FIG. 1, intermediate members 40 are disposed only between neighboring solar cell strings in the embodiments, intermediate members 40 may be formed between solar cells 11 neighboring in the column direction.

4. Variations 1 to 5 of Intermediate Member

Intermediate members 40 according to the embodiments each are a member including, as a main component, a polymer material having a higher polarity or a higher water absorbability than the first polyolefin-based material and the second polyolefin-based material. In addition, intermediate members 40 are disposed in the interface between front surface encapsulant member 60 and back surface encapsulant member 70, the interface being regions in which no solar cell 11 is disposed in the plan view. In sum, intermediate members 40 may have a structure satisfying those materials and the disposition. Here, an intermediate member according to the embodiments not only has a superior water absorbability and a superior hygroscopicity as described above, but also preferably has a light diffusion function and a light reflection function. Hereinafter, Variations 1 to 7 each indicate that an intermediate member according to the embodiments further has the light diffusion function and the light reflection function.

Figure 6A:
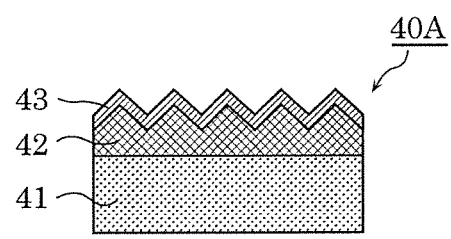
FIG. 6A is a structural cross-sectional view of an intermediate member according to Variation 1 of the embodiments.

FIG. 6A is a structural cross-sectional view of an intermediate member according to Variation 1 of the embodiments. It is to be noted that FIG. 6A and FIGS. 6B to 8B each are a cross-sectional view when an intermediate member disposed between solar cells 11 neighboring in the row direction is cut in the row direction. Intermediate member 40A illustrated by FIG. 6A includes first polymer layer 41, second polymer layer 42, and metal layer 43.

First polymer layer 41 is a member which has a bottom surface in contact with back surface encapsulant member 70 and includes, as a main component, a polymer material having a higher polarity or a higher water absorbability than first polyolefin-based material and second polyolefin-based material. The polymer material included in first polymer layer 41 is preferably ethylene-vinyl acetate (EVA), for example.

Second polymer layer 42 is a member which is formed on a front surface of first polymer layer 41 and includes, as a main component, a polymer material harder than the polymer material included in first polymer layer 41. It is to be noted that second polymer layer 42 includes ridges and troughs. Applying a hard polymer material as the material of second polymer layer 42 leads to improve a controllability of surface processing for second polymer layer 42, which makes it possible to improve the precision of a projection-depression shape. It is preferred that the aforementioned polymer material included in second polymer layer 42 be polyethylene terephthalste (PET), for example.

Metal layer 43 is a metal member formed on a front surface of second polymer layer 42, and a surface of metal layer 43 not in contact with second polymer layer 42 is in contact with front surface encapsulant member 60. It is preferred that metal layer 43 include, for example, Al having a high reflectance for light.

Here, metal layer 43 includes ridges and troughs. With this, light entering from a front surface side is reflected multidirectionally by the front surface of metal layer 43. In other words, intermediate member 40A has the light diffusion function and the light reflection function. Consequently, light not directly entering solar cell 11 can be redistributed to solar cell 11, and thus it is possible to increase a total photoelectric conversion efficiency of the solar cell module. Moreover, intermediate member 40A absorbs vaporized moisture by virtue of first polymer layer 41. As a result, intermediate member 40A does not expand in volume, and it is possible to prevent bulging (volume expansion) and bubbles from occurring in the interface between front surface encapsulant member 60 and back surface encapsulant member 70. Accordingly, on top of reducing corrosion of solar cell 11 and preventing the bulging or the separation, it is possible to increase the total photoelectric conversion efficiency of the solar cell module.

Figure 6B:
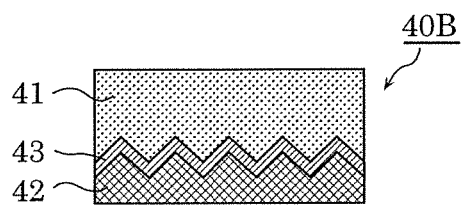
FIG. 6B is a structural cross-sectional view of an intermediate member according to Variation 2 of the embodiments.

FIG. 6B is a structural cross-sectional view of an intermediate member according to Variation 2 of the embodiments. Intermediate member 40B illustrated by the figure is the same as intermediate member 40A according to Variation 1 in including first polymer layer 41, second polymer layer 42, and metal layer 43, but differs from intermediate member 40A in a lamination relationship (order). Hereinafter, description of the same points as Variation 1 is omitted, and only different points in structure will be described.

Second polymer layer 42 is a member which has a bottom surface in contact with back surface encapsulant member 70 and includes, as a main component, a polymer material harder than the aforementioned polymer material included in first polymer layer 41.

Metal layer 43 is a metal member formed on a front surface of second polymer layer 42.

First polymer layer 41 is a member which is formed on a front surface of metal layer 43 and includes, as a main component, a polymer material having a higher polarity or a higher water absorbability than first polyolefin-based material and second polyolefin-based material.

Here, metal layer 43 includes ridges and troughs. With this, light passing through first polymer layer 41 from a front surface side is reflected multidirectionally by the front surface of metal layer 43. In other words, intermediate member 40B has the light diffusion function and the light reflection function. Consequently, light not directly entering solar cell 11 can be redistributed to solar cell 11, and thus it is possible to increase a photoelectric conversion efficiency of solar cell module 1. Moreover, intermediate member 40B absorbs vaporized moisture by virtue of first polymer layer 41. As a result, intermediate member 40B does not expand in volume, and it is possible to prevent bulging (volume expansion) and bubbles from occurring in the interface between front surface encapsulant member 60 and back surface encapsulant member 70. Accordingly, on top of reducing corrosion of solar cell 11 and preventing the bulging or the separation, it is possible to increase a total photoelectric conversion efficiency of the solar cell module.

Figure 6C:
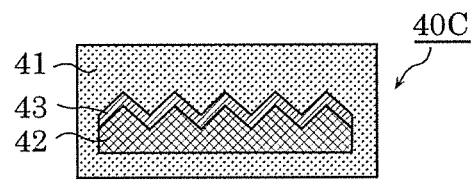
FIG. 6C is a structural cross-sectional view of an intermediate member according to Variation 3 of the embodiments.

FIG. 6C is a structural cross-sectional view of an intermediate member according to Variation 3 of the embodiments. Intermediate member 40C illustrated by the figure is the same as intermediate member 40B according to Variation 2 in including first polymer layer 41, second polymer layer 42, and metal layer 43, but differs from intermediate member 40B in a formation range of first polymer layer 41. Hereinafter, description of the same points as Variation 2 is omitted, and only different points in structure will be described.

Second polymer layer 42 is a member which has a bottom surface in contact with first polymer layer 41 and includes, as a main component, a polymer material harder than the aforementioned polymer material included in first polymer layer 41.

Metal layer 43 is a metal member formed on a front surface of second polymer layer 42.

First polymer layer 41 is a member which is formed to cover second polymer layer 42 and metal layer 43 and includes, as a main component, a polymer material having a higher polarity or a higher water absorbability than the first polyolefin-based material and the second polyolefin-based material.

Here, metal layer 43 includes ridges and troughs. With this, light passing through first polymer layer 41 from a front surface side is reflected multidirectionally by the front surface of metal layer 43. In other words, intermediate member 40C has the light diffusion function and the light reflection function. Consequently, light not directly entering solar cell 11 can be redistributed to solar cell 11, and thus it is possible to increase a total photoelectric conversion efficiency of the solar cell module. Moreover, intermediate member 40C absorbs vaporized moisture by virtue of first polymer layer 41. As a result, intermediate member 40C does not expand in volume, and it is possible to prevent bulging (volume expansion) and bubbles from occurring in the interface between front surface encapsulant member 60 and back surface encapsulant member 70. Accordingly, on top of reducing corrosion of solar cell 11 and preventing the bulging or the separation, it is possible to increase the total photoelectric conversion efficiency of the solar cell module.

Moreover, intermediate member 40C has a structure in which first polymer layer 41 covers metal layer 43, and thus it is possible to prevent the same poles of solar cells 11 neighboring across intermediate member 40C from short-circuiting via metal layer 43.

Furthermore, with the structures of intermediate member 40A illustrated by FIG. 6A and intermediate member 40B illustrated by FIG. 6B, limiting a formation range of metal layer 43 makes it possible to exclude the possibility that the same poles of neighboring solar cells 11 short-circuit.

Figure 7A:
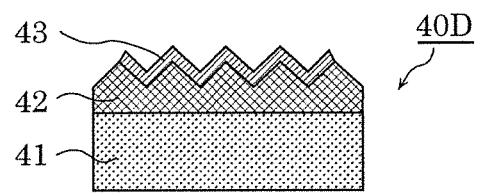
FIG. 7A is a structural cross-sectional view of an intermediate member according to Variation 4 of the embodiments.

FIG. 7A is a structural cross-sectional view of an intermediate member according to Variation 4 of the embodiments. Intermediate member 40D illustrated by the figure is the same as intermediate member 40A according to Variation 1 in including first polymer layer 41, second polymer layer 42, and metal layer 43, but differs from intermediate member 40A only in a formation range of metal layer 43. Hereinafter, description of the same points as Variation 1 is omitted, and only different points in structure will be described.

Metal layer 43 is a metal member formed on a front surface of second polymer layer 42. Here, metal layer 43 is not formed as far as ends of the front surface of second polymer layer 42. In other words, second polymer layer 42 has the ends of the front surface at which metal layer 43 is not formed. With this, it is possible to prevent the same poles of solar cells 11 neighboring across intermediate member 40D from short-circuiting via metal layer 43.

Figure 7B:
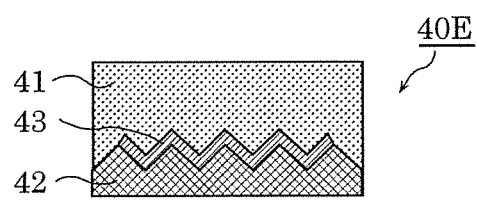
FIG. 7B is a structural cross-sectional view of an intermediate member according to Variation 5 of the embodiments.

FIG. 7B is a structural cross-sectional view of an intermediate member according to Variation 5 of the embodiments. Intermediate member 40E illustrated by the figure is the same as intermediate member 40B according to Variation 2 in including first polymer layer 41, second polymer layer 42, and metal layer 43, but differs from intermediate member 40B only in a formation range of metal layer 43. Hereinafter, description of the same points as Variation 2 is omitted, and only different points in structure will be described.

Metal layer 43 is a metal member formed on a front surface of second polymer layer 42. Here, metal layer 43 is not formed as far as ends of the front surface of second polymer layer 42. In other words, second polymer layer 42 has the ends of the front surface at which metal layer 43 is not formed. With this, it is possible to prevent the same poles of solar cells 11 neighboring across intermediate member 40E from short-circuiting via metal layer 43.

It is to be noted that although the projection-depression shapes of metal layers 43 and second polymer layers 42 illustrated by FIGS. 6A, 6B, 6C, 7A, and 7B are regular shapes, the projection-depression shapes may be random shapes.

Moreover, although the front surfaces of second polymer layers 42 illustrated by FIGS. 6A, 6B, 6C, 7A, and 7B have the projection-depression shapes, the present disclosure is not limited to this. The front surface of second polymer layer 42 may have a flat shape, and only metal layer 43 may have a projection-depression shape. In this case, a thickness of metal layer 43 may be adjusted depending on a necessary height of the projections and the depressions.

Furthermore, although the intermediate members illustrated by FIGS. 6A, 6B, 6C, 7A, and 7B each include metal layer 43, the present disclosure is not limited to this. The intermediate members each may not include metal layer 43. Even with this structure, the intermediate members can have the light diffusion function.

Moreover, the intermediate members illustrated by FIGS. 6A, 6B, 6C, 7A, and 7B each may not have the projection-depression shape. In this case, surface roughening is preferably performed on the front surface of metal layer 43. With this, the intermediate members can have the light diffusion function.

5. Variations 6 and 7 of Intermediate Member

It is to be noted that in a manufacturing process of a solar cell module, after a step for disposing an intermediate member between neighboring solar cells 11, front surface protective member 80, back surface protective member 90, front encapsulant member 60, and back surface encapsulant member 70 are formed in predetermined positions. For this reason, in the step for disposing the intermediate member, the intermediate member needs to be fixed between neighboring solar cells 11. Hereinafter, Variations 6 and 7 each describe fixing the intermediate member between neighboring solar cells 11.

Figure 8A:
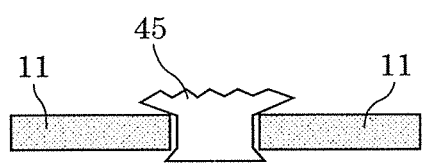
FIG. 8A is a structural cross-sectional view of an intermediate member and solar cells according to Variation 6 of the embodiments.
Figure 8B:
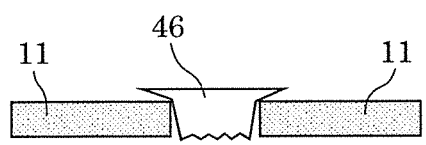
FIG. 8B is a structural cross-sectional view of an intermediate member and solar cells according to Variation 7 of the embodiments.

FIG. 8A is a structural cross-sectional view of an intermediate member and solar cells according to Variation 6 of the embodiments. In addition, FIG. 8B is a structural cross-sectional view of an intermediate member and solar cells according to Variation 7 of the embodiments. FIGS. 8A and 8B each illustrate cross sections of two neighboring solar cells 11 and a corresponding one of intermediate members 45 and 46 disposed between two neighboring solar cells 11.

Intermediate member 45 illustrated by FIG. 8A has a shape that areas of a front surface and a back surface of intermediate member 45 are larger than an area of a cross section in a central region which is in the middle of the front surface and the back surface, the cross section being parallel to the front surface and the back surface. With this shape, in the step for disposing the intermediate member, it is possible to prevent intermediate member 45 from being displaced vertically.

Intermediate member 46 illustrated by FIG. 8B has a shape that a front surface of intermediate member 46 is larger than a back surface of intermediate member 46, a width of the front surface is greater than a distance between two neighboring solar cells 11, and a width of the back surface is less than the distance between two neighboring solar cells 11. In other words, a cross-sectional shape obtained by cutting intermediate member 46 in the row direction is a substantially trapezoidal shape having an upper base longer than a lower base. With this shape, in the step for disposing the intermediate member, it is possible to prevent intermediate member 46 from falling.

With intermediate member 45 according to Variation 6 and intermediate member 46 according to Variation 7, the intermediate members do not need to be bonded to neighboring solar cells 11, using an adhesive or the like. Accordingly, it is possible to manufacture at low cost a solar cell module having intermediate members disposed with high precision.

It is to be noted that intermediate member 45 illustrated by FIG. 8A has ridges and troughs on the front surface, and intermediate member 46 illustrated by FIG. 8B has ridges and troughs on the back surface. With this, intermediate members 45 and 46 have the light diffusion function and the light reflection function. Here, the laminated structure of the intermediate members according to Variations 1 to 5 is applied to intermediate members 45 and 46 having the projections and the depressions.

Moreover, intermediate members 45 and 46 may have a structure having no ridges and troughs as a structure without the light diffusion function.

6. Advantageous Effects Etc.

Solar cell module 1 according to the embodiments includes: a plurality of solar cells 11; front surface encapsulant member 60 which is disposed on a front surface side of the plurality of solar cells 11 and includes a first polyolefin-based material; back surface encapsulant member 70 which is disposed on a back surface side of the plurality of solar cells 11 and includes a second polyolefin-based material; intermediate member 40 which is disposed between front surface encapsulant member 60 and back surface encapsulant member 70, is in contact with front surface encapsulant member 60 and back surface encapsulant member 70, and includes a polymer material having either one of a higher polarity and a higher water absorbability than the first polyolefin-based material and the second polyolefin-based material; front surface protective member 80 disposed to place front surface encapsulant member 60 between front surface protective member 80 and the plurality of solar cells 11; and back surface protective member 90 disposed to place back surface encapsulant member 70 between back surface protective member 90 and the plurality of solar cells 11.

With the above configuration, even when a rapid temperature change causes internal moisture to vaporize, intermediate member 40 disposed in an interface between front surface encapsulant member 60 and back surface encapsulant member 70 absorbs the vaporized moisture. As a result, intermediate member 40 does not expand in volume, and it is possible to prevent bulging (volume expansion) and bubbles from occurring in the interface between front surface encapsulant member 60 and back surface encapsulant member 70. Accordingly, front surface encapsulant member 60 including the first polyolefin-based material as the main component and back surface encapsulant member 70 including the second polyolefin-based material as the main component make it possible to reduce corrosion of solar cells 11, and intermediate member 40 makes it possible to prevent the bulging or separation.

Moreover, the aforementioned intermediate member may have a front surface including ridges and troughs.

Accordingly, light entering from the front surface side is diffused by the front surface of the intermediate member. Consequently, light not directly entering solar cells 11 can be redistributed to solar cells 11, and thus it is possible to increase a total photoelectric conversion efficiency of the solar cell module.

Moreover, the aforementioned intermediate member may include: first polymer layer 41 including the polymer material as a main component; second polymer layer 42 including, as a main component, a polymer material harder than the polymer material of first polymer layer 41; and metal layer 43 formed on a front surface of second polymer layer 42.

With this, light entering from the front surface side is reflected by a front surface of metal layer 43. Consequently, light not directly entering solar cells 11 can be redistributed to solar cells 11, and thus it is possible to increase a total photoelectric conversion efficiency of the solar cell module.

Moreover, second polymer layer 42 and metal layer 43 may include ridges and troughs.

Moreover, second polymer layer 42 may be formed on first polymer layer 41.

Moreover, first polymer layer 41 may be formed on metal layer 43.

With this, light entering from the front surface side is reflected and diffused by the front surface of metal layer 43. Consequently, light not directly entering solar cells 11 can be redistributed to solar cells 11, and thus it is possible to increase a total photoelectric conversion efficiency of the solar cell module.

Moreover, first polymer layer 41 may be formed to cover metal layer 43 and second polymer layer 42.

With this, it is possible to prevent the same poles of solar cells 11 neighboring across intermediate member 40C from short-circuiting via metal layer 43.

Moreover, the polymer material which is the main component of first polymer layer 41 may be ethylene-vinyl acetate, and the polymer material which is the main component of second polymer layer 42 may be polyethylene terephthalate.

(Others)

The solar cell module according to the present disclosure has been described based on the aforementioned embodiment, but the present disclosure is not limited to the embodiments.

For example, solar cell 11 may have a function as photovoltaic power, and is not limited to the structure of solar cell 11.

Moreover, a light diffusion member may be formed on tab line 20 and connecting line 30 to cover the front surfaces of tab line 20 and connecting line 30.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module comprising:
   a plurality of solar cells;
   a front surface encapsulant member which is disposed on a front surface side, as a light receiving surface side, of the plurality of solar cells and includes a first polyolefin-based material;
   a back surface encapsulant member which is disposed on a back surface side of the plurality of solar cells and includes a second polyolefin-based material;
   an intermediate member which is disposed between the front surface encapsulant member and the back surface encapsulant member, is in contact with the front surface encapsulant member and the back surface encapsulant member, and includes: a first polymer layer including, as a main component thereof, a first polymer material having either one of a higher polarity and a higher water absorbability than the first polyolefin-based material and the second polyolefin-based material; and a second polymer layer including, as a main component thereof, a second polymer material harder than the first polymer material of the first polymer layer, wherein the second polymer layer is disposed on a front side with respect to the first polymer layer and the first polymer layer is disposed on a back side with respect to the second polymer layer in such a manner that a back surface of the first polymer layer is in contact with the back surface encapsulant member;
   a front surface protective member disposed to place the front surface encapsulant member between the front surface protective member and the plurality of solar cells; and
   a back surface protective member disposed to place the back surface encapsulant member between the back surface protective member and the plurality of solar cells.

2. The solar cell module according to claim 1,
   wherein the intermediate member has a front surface including ridges and troughs.

3. The solar cell module according to claim 1,
   wherein the intermediate member further includes:
   a metal layer formed on a front surface of the second polymer layer.

4. The solar cell module according to claim 3,
   wherein the second polymer layer and the metal layer include ridges and troughs.

5. The solar cell module according to claim 4,
wherein the second polymer layer is formed on the first polymer layer.

6. The solar cell module according to claim 4,
wherein the first polymer layer is formed on the metal layer.

7. The solar cell module according to claim 4,
wherein the first polymer layer is formed to cover the metal layer and the second polymer layer.

8. The solar cell module according to claim 3,
wherein the first polymer material which is the main component of the first polymer layer is ethylene-vinyl acetate, and the second polymer material which is the main component of the second polymer layer is polyethylene terephthalate.

* * * * *